United States Patent
Paci et al.

(10) Patent No.: US 10,094,891 B2
(45) Date of Patent: Oct. 9, 2018

(54) INTEGRATED AMR MAGNETORESISTOR WITH LARGE SCALE

(71) Applicant: STMicroelectronics S.r.l., Agrate Brianza (IT)

(72) Inventors: Dario Paci, Sedriano (IT); Marco Marchesi, Borgonovo Val Tidone (IT); Marco Morelli, Bareggio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 117 days.

(21) Appl. No.: 15/135,793

(22) Filed: Apr. 22, 2016

(65) Prior Publication Data
US 2016/0377691 A1  Dec. 29, 2016

(30) Foreign Application Priority Data

Jun. 26, 2015  (IT) .................. 102015000028222

(51) Int. Cl.
*G01R 33/09* (2006.01)
*G01R 33/00* (2006.01)
*G01R 33/07* (2006.01)
*G01R 33/025* (2006.01)

(52) U.S. Cl.
CPC ........ *G01R 33/096* (2013.01); *G01R 33/0011* (2013.01); *G01R 33/025* (2013.01); *G01R 33/07* (2013.01); *G01R 33/09* (2013.01)

(58) Field of Classification Search
CPC ..... G01R 33/096; G01R 33/07; G01R 33/011
USPC ...... 324/244, 252, 239, 202, 207.12, 207.21
See application file for complete search history.

(56) References Cited

U.S. PATENT DOCUMENTS

| | | | |
|---|---|---|---|
| 2007/0121249 A1* | 5/2007 | Parker | G01R 33/04 360/123.1 |
| 2014/0159717 A1 | 6/2014 | Paci et al. | |
| 2014/0232390 A1 | 8/2014 | Fu et al. | |
| 2014/0353785 A1 | 12/2014 | Paci | |

OTHER PUBLICATIONS

Italian Search Report and Written Opinion for IT 102015000028222 dated Feb. 18, 2016 (9 pages).
First Office Action and Search Report for co-pending CN Appl. No. 201510860677.7 dated Jun. 19, 2018 (9 pages).

* cited by examiner

*Primary Examiner* — Reena Aurora
(74) *Attorney, Agent, or Firm* — Crowe & Dunlevy

(57) ABSTRACT

An integrated AMR magnetoresistive sensor has a magnetoresistor, a set/reset coil and a shielding region arranged on top of each other. The set/reset coil is positioned between the magnetoresistor and the shielding region. The magnetoresistor is formed by a magnetoresistive strip of an elongated shape having a length in a first direction parallel to the preferential magnetization direction and a width in a second direction perpendicular to the first direction. The set/reset coil has at least one stretch extending transversely to the magnetoresistive strip. The shielding region is a ferromagnetic material and has a width in the second direction greater than the width of the magnetoresistive strip so as to attenuate the external magnetic field traversing the magnetoresistive strip and increase the sensitivity scale of the magnetoresistive sensor.

22 Claims, 5 Drawing Sheets

INTEGRATED AMR MAGNETORESISTOR WITH LARGE SCALE

PRIORITY CLAIM

This application claims priority from Italian Application for Patent No. 102015000028222 filed Jun. 26, 2015, the disclosure of which is incorporated by reference.

TECHNICAL FIELD

The present invention relates to a large scale integrated magnetoresistor of AMR (anisotropic magnetoresistance) type.

BACKGROUND

AMR magnetic-field sensors are used in a plurality of applications and systems, for example in compasses, in systems for detecting ferromagnetic characteristics, in detecting electric currents, and in a wide range of other applications, by virtue of their capacity of detecting natural magnetic fields (for example, the Earth's magnetic field) and magnetic fields generated by electrical components (such as electrical or electronic devices and lines traversed by electric current).

As is known, such magnetoresistive sensors exploit the capacity of appropriate ferromagnetic materials (referred to as magnetoresistive materials, for example the material known as "permalloy" formed by a Fe—Ni alloy) of modifying their own resistance in the presence of an external magnetic field.

Currently, magnetoresistive sensors of an integrated type are manufactured as strips of magnetoresistive material on a substrate of semiconductor material, for example silicon. During manufacture, the magnetoresistive material strip is magnetized so as to have a preferential magnetization in a preset direction, for example the longitudinal direction of the strip.

In the absence of external magnetic fields, the magnetization maintains the imposed direction, and the strip has a maximum resistance. In the presence of external magnetic fields whose direction is different from the preferential magnetization, the angle between the magnetization of the strip and the current flowing therein changes, as its resistance, which decreases, as illustrated in FIGS. 1A and 1B.

In FIG. 1A, showing the magnetization M in the absence of an external magnetic field, a magnetoresistor 1 is formed by a magnetoresistive strip 2 having a longitudinal direction parallel to axis X (also referred to as the "easy axis", since this direction is the direction of easier magnetization of the strip). The magnetoresistor 1 is supplied with a current I flowing in the longitudinal direction of the strip. In this condition, the magnetization M is parallel to the easy axis EA.

In FIG. 1B, the magnetoresistor 1 is immersed in an external magnetic field $H_y$ parallel to axis Y (referred to as also as the "hard axis" since this is the direction of more difficult magnetization of the magnetoresistive strip 2). In this condition, the external magnetic field $H_y$ causes a rotation of the magnetization M through an angle α with respect to the current I, causing a reduction of the resistance of the magnetoresistive strip 2 according to a law correlated to $\cos^2\alpha$.

In order to linearize the plot of the resistance R at least in an operating portion of the curve, it is known to form, above the magnetoresistive strip 2, transverse strips 3 (referred to as "barber poles"), of conductive material (for example aluminum), arranged at a constant distance and with an inclination of 45° with respect to the direction of the easy axis EA, as illustrated in FIG. 2. In this situation, the direction of the current I changes, but not the magnetization M, and the resistance has a linear characteristic around the zero of the external magnetic field. In this way, it is possible to detect easily any magnetic fields oriented along or having a component parallel to the axis Y.

FIG. 3 shows a magnetoresistive sensor 4 including four magnetoresistors 1 of the type illustrated in FIG. 2, connected to form a Wheatstone bridge, with the transverse strips 3 arranged in an alternating way in each branch 4a and 4b of the bridge. The two branches 4a, 4b are connected at two input nodes 5, 6, with a biasing voltage Vb applied between them. In this way, the output voltage Vo between the intermediate nodes 7, 8 of the branches 4a, 4b is correlated to the existing external magnetic field $H_y$.

The magnetoresistive sensors of the type indicated above work properly provided that each magnetoresistor 1 is magnetized in the direction of the easy axis in the absence of external magnetic fields and as long as the imposed magnetization M persists.

In order to maintain the imposed magnetization M, magnetoresistive sensors generally comprise a set/reset coil (designated by 10 in FIG. 4). The set/reset coil 10 enables refresh operations, consisting in repeated rapid magnetization steps in the desired direction. As may be noted from FIGS. 4 and 5, the set/reset coil 10, here square spiral-shaped, has stretches 11 extending transversely, preferably perpendicular, to the longitudinal direction of the magnetoresistive strip 2 parallel to the easy axis EA. In the example illustrated (see in particular the cross-section of FIG. 5), the set/reset coil 10 is formed in a third metal level M3, above the magnetoresistive strip 2. In turn, the magnetoresistive strip 2 is formed below a first metal level M1, and the latter forms the barber poles 3. The described structure is further formed in an insulation structure 12 overlying a substrate 13, for example silicon, and forming with the latter an integrated chip 15.

In practice, during refresh, the set/reset coil 10 is supplied with a high current and generates a magnetic field B, which, in the area of the magnetoresistive strip 2, is parallel to the direction of the easy axis (see, for example, U.S. Pat. No. 5,247,278, incorporated by reference).

Currently available magnetoresistive sensors, which operate, for example, as linear or angular position sensors or as current sensors, may not, however, be easily used in industrial processes and in the automotive sector due to their rather reduced sensitivity scale.

There is a need in the art to provide a magnetoresistive sensor able to overcome the foregoing and other drawbacks.

SUMMARY

A shielding layer, of ferromagnetic material, is arranged above the magnetoresistive element. The shielding layer has a greater width, perpendicularly to the easy axis EA, than the magnetoresistive element. In this way, the shielding layer concentrates in it the external magnetic field, and the underlying magnetoresistor "sees" a field that is attenuated down to the saturation value of the shielding layer (sleeping area of the magnetoresistive sensor). After the saturation value, the shielding layer is no longer able to attenuate the external field any further, but the field seen by the magnetoresistor is in any case attenuated. Consequently, for external magnetic fields higher than the saturation value of the shielding layer, the attenuated value whereof is lower than the saturation value of the magnetoresistor, the magnetoresistor may detect the external magnetic field (i.e., arranges itself in the measurement area).

The shielding interval may be regulated through a suitable design of the shielding layer, in particular its width. In this way, it is possible to form a magnetoresistive sensor having a measurement area adapted to the desired field characteristics.

Furthermore, by providing a number of magnetoresistive sensors having different measurement areas, it is possible to obtain a magnetoresistor device having a considerably enlarged scale as compared to single magnetoresistive sensors.

BRIEF DESCRIPTION OF THE DRAWINGS

For a better understanding, preferred embodiments thereof are now described, purely by way of non-limiting example, with reference to the attached drawings, wherein.

DETAILED DESCRIPTION

Figure 6:
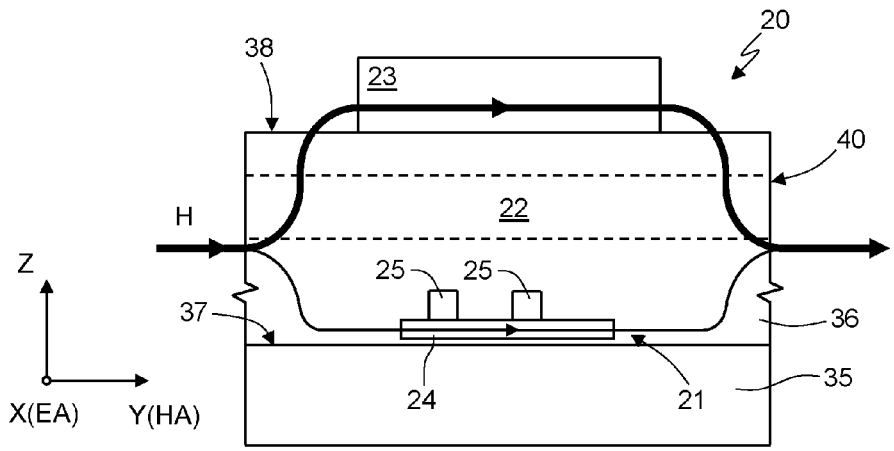
FIG. 6 is a cross-section of a magnetoresistive sensor represented schematically to illustrate the present operating principle.
Figure 7:
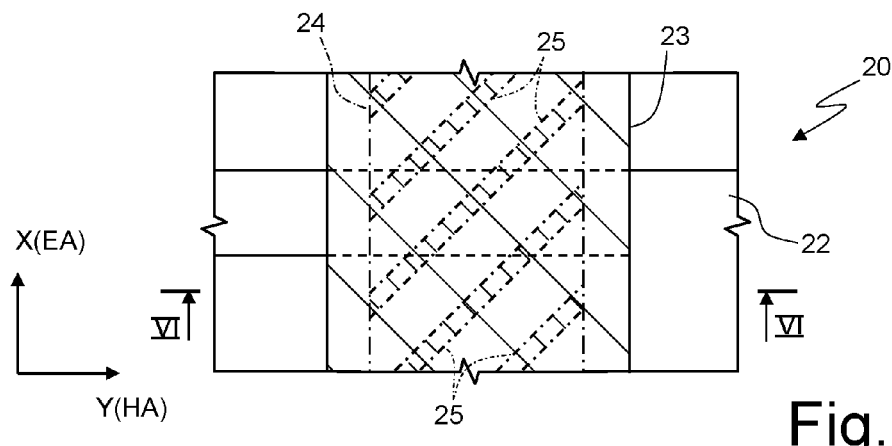
FIG. 7 is a top plan view of the sensor of FIG. 6.

FIGS. 6 and 7 schematically show a magnetoresistive unit 20 comprising a magnetoresistor 21, a set/reset coil 22, and a shielding region 23, arranged on top of each other.

In turn, the magnetoresistor 21 comprises a magnetoresistive strip 24 and barber poles 25.

The magnetoresistive strip 24 is of magnetoresistive material, such as for example permalloy (a ferromagnetic alloy containing iron and nickel). The magnetoresistive strip 24 has an elongated shape and thus has a principal dimension (length) in the direction of the easy axis EA (direction parallel to axis X, perpendicular to the drawing plane) and a minor dimension (width) in the direction of the hard axis HA (direction parallel to axis Y).

The magnetoresistive strip has, for example, a length comprised between 30 and 300 µm, a width comprised between 1 and 20 µm, and a thickness comprised between 10 and 100 nm.

The barber poles 25 are of conductive material (for example aluminum), and are arranged at a constant distance, with an inclination of 45° with respect to the direction of the easy axis EA.

The set/reset coil 22, of conductive material, such as aluminum, is arranged between the magnetoresistive strip 24 and the shielding region 23. The set/reset coil 22 has at least one portion (portion represented) extending perpendicularly to the magnetoresistive strip 24.

The shielding region 23 is of ferromagnetic material, for example of soft, in particular isotropic, ferromagnetic material such as permalloy or other material based on nickel, cobalt, or cobalt-iron, such as cobalt-iron-silicon-boron (CoFeSiB) or cobalt-iron-silicon-molybdenum or cobalt-iron-silicon-niobium, a cobalt-based amorphous material, or an iron-based nanocrystalline material, such as to have a coercivity Hc close to zero (to obtain a high concentration effect) and a permeability as high as possible (to obtain a high shielding effect).

The shielding region 23 extends over the magnetoresistive strip 24 and the set/reset coil 22 and has, in the direction of the hard axis of the magnetoresistive strip 24 (direction Y), a dimension (width) greater than the width of the magnetoresistive strip 24.

The shielding region 23 has dimensions linked to the shielding effect that it is desired to obtain, as explained below with reference to FIG. 8, and has, for example, a thickness comprised between 1 and 10 µm and a width comprised between 100 and 500 µm.

Figure 5:
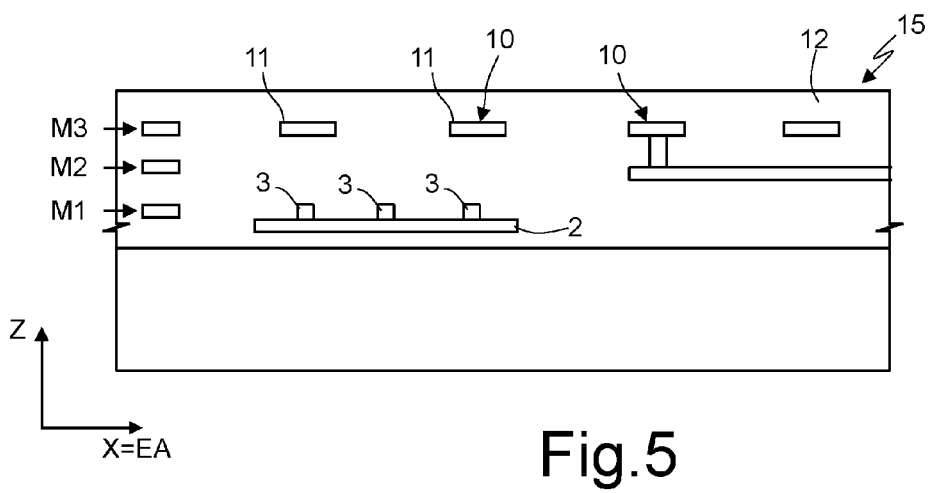
FIG. 5 is a cross-section, taken along section line V-V, of the magnetoresistive sensor of FIG. 4.

The magnetoresistive unit 20 is formed in a chip 40 on a substrate 35 of semiconductor material, such as silicon, with the magnetoresistor 21 and the coil 22 embedded in an insulating layer 36, for example a TEOS (tetraethylorthosilicate) layer. The magnetoresistor 21 is formed directly on a top surface 37 of the substrate 35, the set/reset coil 22 is formed on the magnetoresistive strip 24 in one or more metal levels (as is shown in FIG. 5), and the shielding region 23 extends over a top surface 38 of the insulating layer 36.

Figure 8:
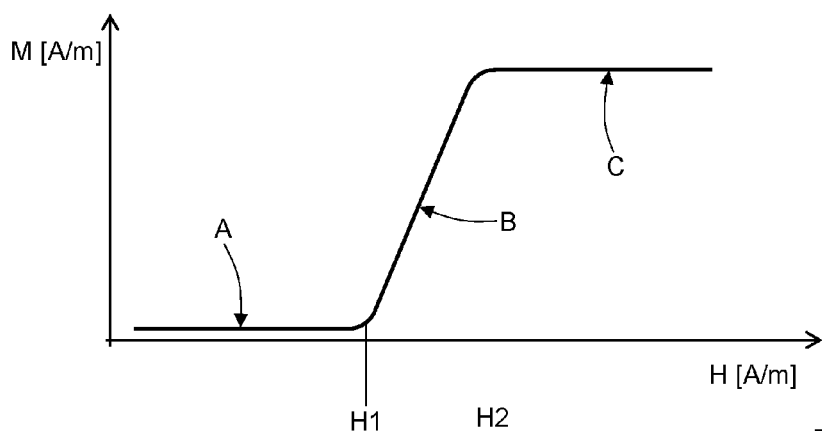
FIG. 8 shows the relationship between the magnetization M and the external field H for a ferromagnetic material.

In detail, the shielding region 23, since it is of ferromagnetic material, has a magnetization characteristic M as a function of the external magnetic field H as illustrated in FIG. 8. The illustrated characteristic has three portions A, B, C where the shielding region 23 has a different behavior. In particular, in the curve portion B, where the external field H is comprised between the first saturation value H1 and a second saturation value H2, the shielding layer 23 is in a linear area and concentrates the majority of the external field H within it, as shown by the arrows of FIG. 6. Consequently, in this area, the shielding layer 23 is active and shields the magnetoresistor 21, which thus is passed by a very low magnetic field, substantially below the sensitivity limit of the magnetoresistor 21. In the curve portions A and C, below the first value H1 and above the second value H2 of the external magnetic field H, the magnetization has a flat profile, and the shielding region 23 is unable to "absorb" further magnetic field lines. The external magnetic field H thus reaches the magnetoresistor 21, albeit attenuated by a substantially fixed value. Consequently, in these areas, the magnetoresistor 21 "sees" an external field correlated with the external field, but reduced, and thus within the area of sensitivity of the magnetoresistor 21. Consequently, above the saturation value of the shielding region 23, the magnetoresistor 21 is in the measurement area and has a resistance that varies with the external magnetic field H (but for the shift due to attenuation of the shielding region 23).

Since, as is known, it is possible to vary the value of the external field H at which the saturation of a ferromagnetic material occurs by varying the geometry thereof so as to act on the demagnetizing factor (see, for example, "Demagnetizing Factors of the General Ellipsoid", J. A. Osborn, Physical Review, Vol. 67. Numbers 11 and 12, Jun. 1 and 18, 1945, incorporated by reference), by acting on the thickness and on the width of the shielding region 23 it is possible to regulate the sensitivity range of the magnetoresistive unit 20.

For instance, the length L may be comprised between 100 and 600 µm and the thickness may be comprised between 1 and 10 µm.

Furthermore, by providing in a same sensor more magnetoresistive units 20 designed to have different sensitivity intervals and thus different measurement areas, it is possible to provide a magnetoresistive sensor having a very wide total sensitivity range.

Figure 9:
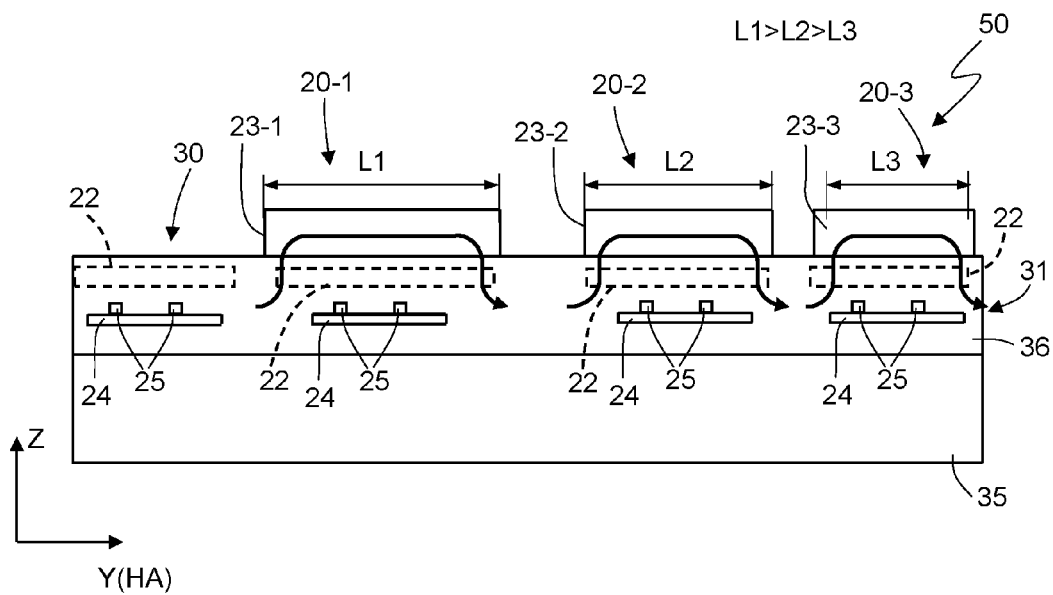
FIG. 9 is a cross-section of an embodiment of the present magnetoresistive sensor.

For instance, FIG. 9 is a schematic illustration of a magnetoresistive sensor 50 having four magnetoresistive units 30, 20-1, 20-2 and 20-3 configured to have adjacent sensitivity intervals.

Figure 4:
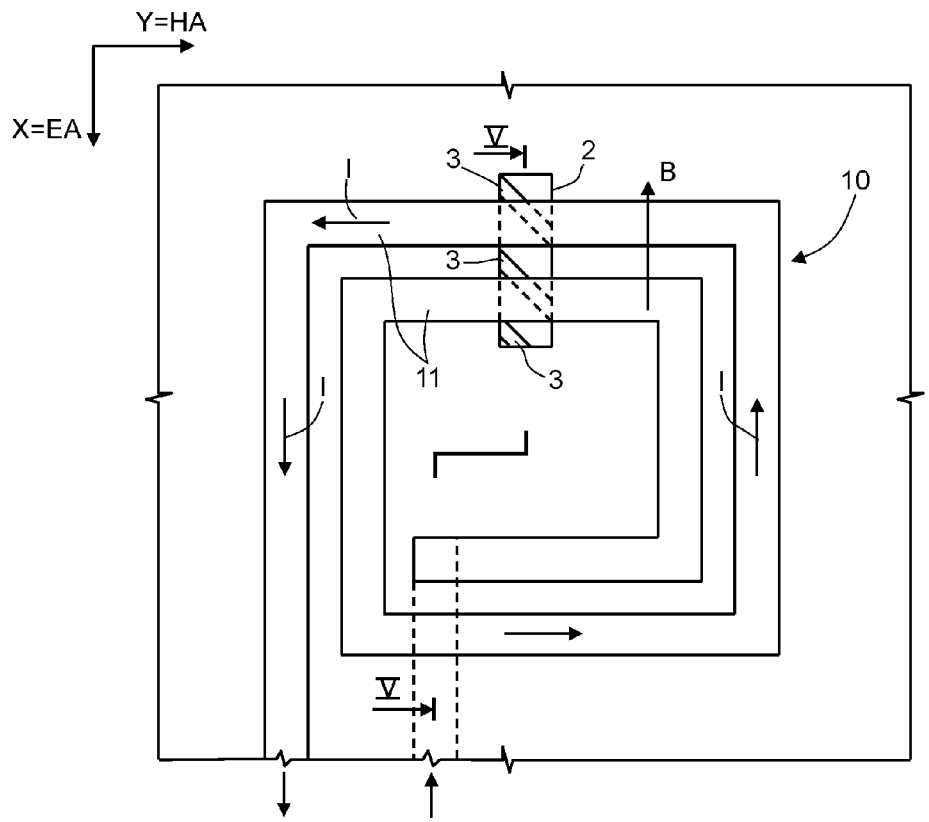
FIG. 4 is a schematic top plan view of a known magnetoresistive sensor having a set/reset coil.

In detail, the sensor 40 has a first unit 30 without any shielding region 23 and thus formed as the magnetoresistor of FIGS. 4-5; a second unit 20-1, having a shielding region 23-1 characterized by a width L1; a third unit 20-2, having a shielding region 23-2 characterized by a width L2; and a fourth unit 20-3, having a shielding region 23-3 characterized by a width L3, with L1>L2>L3.

In this way, it is possible to set the widths L1-L3 so that the first unit 30 is sensitive to external magnetic fields with a magnitude comprised in a first field interval up to a first value H3; the second unit 20-2 is sensitive to external magnetic fields with a magnitude comprised in a second field interval H3-H4 adjacent to the first interval; the third unit 20-3 is sensitive to external magnetic fields with a magnitude comprised in a third field interval H4-H5 adjacent to the second interval; and the fourth unit 20-4 is sensitive to external magnetic fields with a magnitude comprised in a fourth field interval H5-H6 adjacent to the third interval.

For instance, with a shielding region 23 of cobalt-based amorphous material, having a thickness of 1 µm, by setting L1=500 µm, L2=250 µm, and L3=170 µm, H3=10 G, H4=20 G, H5=30 G, H6=40 G.

It follows that the magnetoresistive sensor 50 may have a total sensitivity comprised between 0 and 40 G.

With a different choice of material, for example NiFe, and of thickness, for example 10 µm, it is possible to shield fields of an intensity of up to 120 G and beyond.

Figure 10:
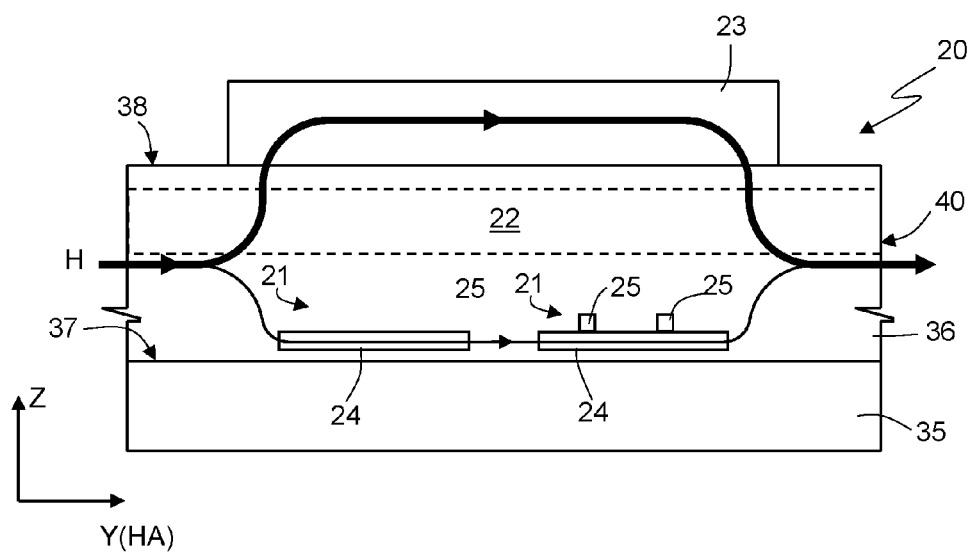
FIG. 10 is a cross-section of an embodiment of the present magnetoresistive sensor.
Figure 11:
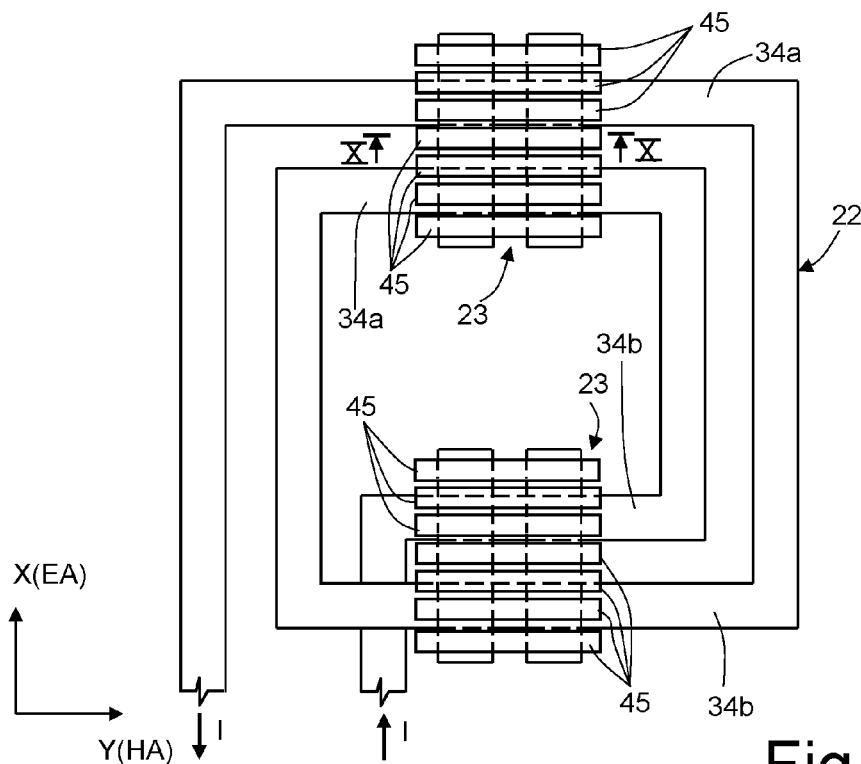
FIG. 11 is a top plan view of an embodiment of the present magnetoresistive sensor.

FIGS. 10 and 11 show an embodiment of a magnetoresistive sensor comprising a plurality of magnetoresistive units 20 of FIG. 7. The same configuration may be used to obtain each magnetoresistive unit 20-1, 20-2 and 20-3 of FIG. 9.

In particular, in the embodiment of FIGS. 10 and 11, two pairs of magnetoresistors 21 extend above two different portions, parallel to each other, of the set/reset coil 22, so that each pair crosses two turns of the coil.

Figure 1A:
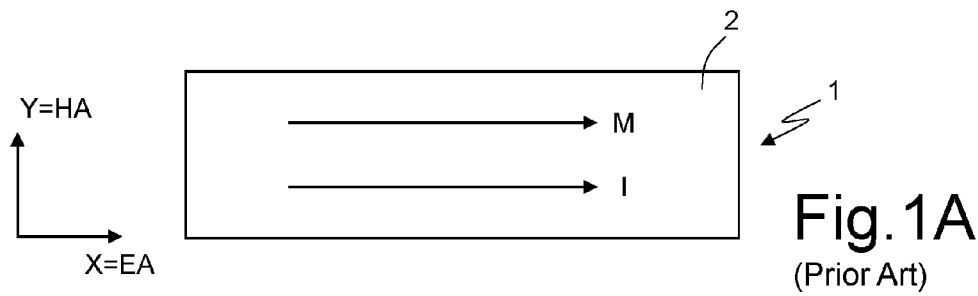
FIGS. 1A and 1B are schematic illustrations of a known magnetoresistor of an AMR type in absence and presence, respectively, of an external magnetic field.
Figure 1B:
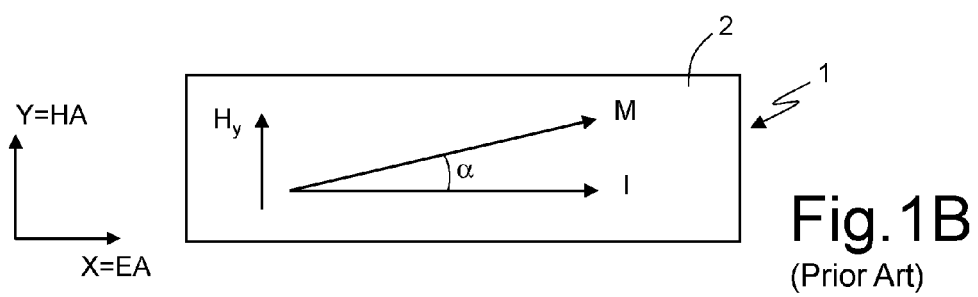
Figure 2:
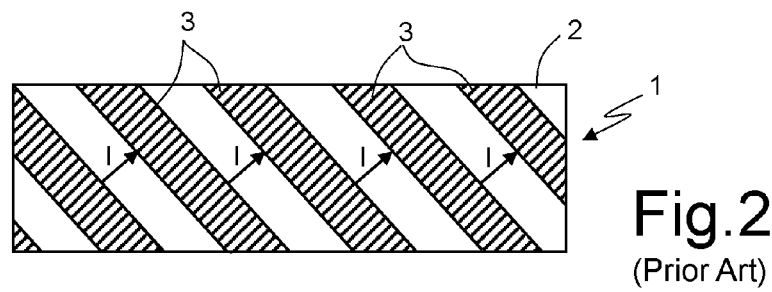
FIG. 2 is a schematic illustration of an embodiment of a known AMR magnetoresistor having barber poles.
Figure 3:
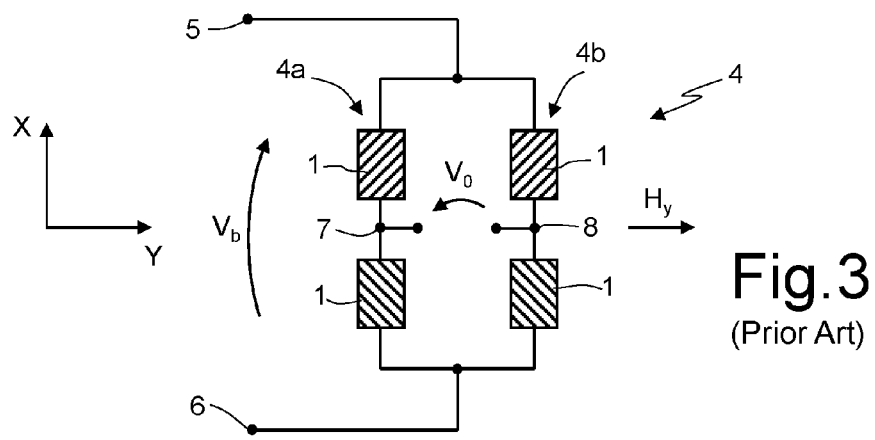
FIG. 3 shows a bridge magnetoresistive sensor formed by magnetoresistors of the type illustrated in FIG. 2.

In a not illustrated manner, the four magnetoresistors 21 may be bridge-connected as illustrated in FIG. 3.

In detail, in FIGS. 10 and 11, the magnetoresistive strips 24 of the magnetoresistors 21 extend parallel to each other and to axis X, are coplanar with respect to each other and are arranged alongside each other in pairs. For simplicity the figures do not show the barber poles 25, which may be oriented all in the same direction or perpendicular in pairs and connected to form the configuration of FIG. 3.

The set/reset coil 22 has at least two stretches 34a, 34b (here, two pairs of stretches 34a, 34b), parallel to each other, each parallel to axis Y so that, in top plan view, each stretch 34a, 34b crosses a respective pair of magnetoresistive strips 24. In the illustrated example, the stretches 34a of a first pair cross two magnetoresistive strips 24 adjacent to each other, and the stretches 34b of a second pair cross two magnetoresistive strips 24 adjacent to each other.

In FIG. 11, the shielding regions 23 are each formed by a plurality of shielding strips 45 for each pair of magnetoresistive strips 24. The shielding strips 45 are transverse to the magnetoresistive strips 24 and thus parallel to each other and to axis Y. In practice, for each pair of stretches 34a, 34b the shielding strips 45 define a rectangular shielding region 23 projecting beyond the width of the pair of magnetoresistive strips 24 arranged alongside each other and substantially covers the length of the magnetoresistive strips 24. The choice of the length of the shielding regions 23 (i.e., of the dimension parallel to easy axis EA) is, as is known, linked to the desired frequency characteristics. The presence of a plurality of shielding strips 45 enables the magnetoresistive sensor to work with frequency variable fields, as known to the person skilled in the art.

The shielding strips 45 have, for example, a width (in direction Y) comprised between 100 and 600 µm, a length (in direction X) comprised between 6 and 30 µm, and are arranged at a mutual distance comprised between half and full length.

In practice, for each pair of magnetoresistive strips 24, the corresponding shielding strips 45 form a plurality of crossing areas vertically aligned to the magnetoresistive strips 24.

Figure 12:
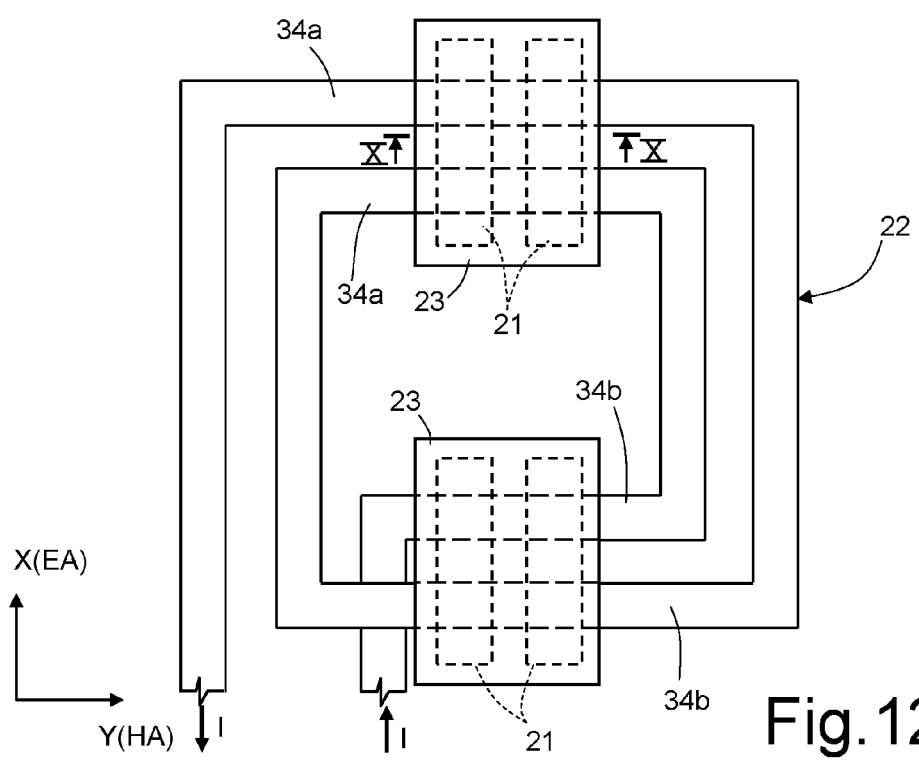
FIG. 12 is a top plan view of an embodiment of the present magnetoresistive sensor.

FIG. 12 shows an embodiment where the shielding regions 23 comprise a single rectangular region for each pair of magnetoresistors 21. In particular, each shielding region 23 completely covers a pair of magnetoresistors 23 arranged adjacent each other. For the rest, the structure of FIG. 12 is the same as FIG. 11 and has the same cross-section as the one shown in FIG. 10.

By virtue of the described solution, the magnetoresistive sensor is able, for a same sensitivity of the magnetoresistive sensor, to increase the measurement interval of external magnetic fields several times as compared to known sensors.

The illustrated structure enables optimization of the set/reset procedures. In fact, during set and reset, the shielding region 23 causes reduction of the magnetic reluctance of the equivalent magnetic circuit and thus increase, for a same current in the coil 22, of the field generated on the magnetoresistor 21, or, for the same magnetization, causes a reduction of the set/reset current, with consequent energy saving.

Furthermore, with the described solution, it is possible to devise layouts compatible with high frequencies, by appropriately choosing the length (in the direction of easy axis EA) of the ferromagnetic strips 45 in the embodiment of FIG. 11.

The described magnetoresistor may advantageously be applied to linear position sensors, angular position sensors, current sensors, magnetic sensors for industrial applications, and magnetic sensors for automotive applications.

Finally, it is clear that modifications and variations may be made to the magnetoresistive sensor described and illustrated herein, without thereby departing from the scope of the present invention, as defined in the attached claims.

For instance, whenever technologically possible or for other reasons, the magnetoresistive strips 24 may be formed above the set/reset coil 22, and the shielding regions 23 may be formed underneath the set/reset coil 22.

Furthermore, by arranging the pairs of magnetoresistors 21 and corresponding shielding regions 23 also on the sides of the coil 22 parallel to axis X in FIGS. 11 and 12, it is possible to obtain a magnetoresistive sensor sensitive to external magnetic fields directed perpendicularly to what illustrated, i.e., in direction X.

The invention claimed is:

1. An integrated magnetoresistive sensor of an anisotropic magnetoresistance (AMR) type, comprising:
    a first magnetoresistive unit including:
        a magnetoresistor comprising a magnetoresistive strip of an elongated shape having a length in a first direction parallel to a preferential magnetization direction and a width in a second direction perpendicular to the first direction;
        a set/reset coil having a stretch transversely extending to the first direction; and
        a shielding region of ferromagnetic material having a width in the second direction greater than the width of the magnetoresistive strip.

2. The magnetoresistive sensor according to claim 1, wherein the magnetoresistor, the set/reset coil and the shielding region are arranged on top of each other, with the set/reset coil arranged between the magnetoresistor and the shielding region.

3. The magnetoresistive sensor according to claim 1, wherein the shielding region is made of a soft ferromagnetic material.

4. The magnetoresistive sensor according to claim 3, wherein the soft ferromagnetic material is selected from the group consisting of permalloy or a material based on cobalt-iron-boron or permalloy.

5. The magnetoresistive sensor according claim 1, wherein the shielding region comprises a plurality of shielding strips extending parallel and adjacent to each other, parallel to the second direction and transverse to the magnetoresistive strip so that the plurality of shielding strips and the magnetoresistive strip have a plurality of vertically aligned portions.

6. The magnetoresistive sensor according to claim 1, wherein the shielding region has a length in the first direction, the length of the shielding region being substantially equal to or greater than the length of the magnetoresistive strip.

7. The magnetoresistive sensor according to claim 1, further comprising an insulating region arranged on a substrate of semiconductor material, wherein the stretch of the set/reset coil extends over the magnetoresistive strip, and the shielding region extends over the stretch of the set/reset coil, and wherein the set/reset coil and magnetoresistive strip are formed in the insulating region and the shielding region is formed on the insulating region.

8. The magnetoresistive sensor according to claim 1, further comprising a non-shielded magnetoresistive unit arranged adjacent the first magnetoresistive unit.

9. The magnetoresistive sensor according to claim 1, further comprising a further magnetoresistive unit adjacent the first magnetoresistive unit, the further magnetoresistive unit comprising:
    a respective magnetoresistive strip having a width in the second direction; and
    a respective shielding region of ferromagnetic material having a respective width in the second direction,
    the width of the respective shielding region of the further magnetoresistive unit being greater than the width of the respective magnetoresistive strip of the further magnetoresistive unit and smaller than the width of the shielding region of the first magnetoresistive unit.

10. The magnetoresistive sensor according to claim 1, wherein the magnetoresistive strip is a first magnetoresistive strip and the sensor comprises a second magnetoresistive strip adjacent and parallel to the first magnetoresistive strip, the shielding region extending transversely to the second magnetoresistive strip, the shielding region having portions vertically aligned to the first and second magnetoresistive strips.

11. The magnetoresistive sensor according to claim 1, wherein the magnetoresistive sensor is one of a linear-position sensor, an angular-position sensor, a current sensor, a magnetic sensor for industrial applications, and a magnetic sensor for automotive applications.

12. An integrated magnetoresistive sensor of an anisotropic magnetoresistance (AMR) type, comprising:
    a plurality of magnetoresistive units positioned adjacent each other, wherein each magnetoresistive unit comprises:
        a magnetoresistive strip having a length in a first direction and a width in a second direction perpendicular to the first direction;
        a set/reset coil having a stretch transversely extending to the first direction; and
        a shielding region of ferromagnetic material having a width in the second direction greater than the width of the magnetoresistive strip;
    wherein the shielding region of a first one of the plurality of magnetoresistive units has a first width and the shielding region of a first one of the plurality of magnetoresistive units has a second width different from the first width.

13. The magnetoresistive sensor of claim 12, wherein the set/reset coil of each magnetoresistive unit is positioned between the magnetoresistive strip and the shielding region.

14. The magnetoresistive sensor of claim 12, wherein the shielding region comprises a plurality of shielding strips extending parallel and adjacent to each other and transverse to the magnetoresistive strip.

15. The magnetoresistive sensor according to claim 12, further comprising a non-shielded magnetoresistive unit arranged adjacent to one of the plurality of magnetoresistive units, said non-shielded magnetoresistive unit comprising a magnetoresistive strip having a length in the first direction and a width in the second direction perpendicular to the first direction;
    a set/reset coil having a stretch transversely extending to the first direction.

16. The magnetoresistive sensor according to claim 12, wherein the width of the shielding region in each magnetoresistive unit is greater than the width of the magnetoresistive strip of that magnetoresistive unit.

17. The magnetoresistive sensor according to claim 12, wherein the magnetoresistive sensor is one of a linear-position sensor, an angular-position sensor, a current sensor, a magnetic sensor for industrial applications, and a magnetic sensor for automotive applications.

18. An integrated magnetoresistive sensor of an anisotropic magnetoresistance (AMR) type, comprising:
    a magnetoresistive strip of an elongated shape having a first length in an easy-axis direction and a first width in a hard-axis direction perpendicular to the easy-axis direction;
    a set/reset coil carrying current in the hard-axis direction; and a shielding region of ferromagnetic material having a second length in the easy-axis direction and a second width in the hard-axis direction;
wherein the second width is greater than the first width.

19. The magnetoresistive sensor according to claim 18, wherein the magnetoresistor, the set/reset coil and the shielding region are arranged on top of each other, with the set/reset coil arranged between the magnetoresistor and the shielding region.

20. The magnetoresistive sensor according to claim 18, wherein the shielding region is made of a soft ferromagnetic material.

21. The magnetoresistive sensor according to claim 20, wherein the soft ferromagnetic material is selected from the group consisting of permalloy or a material based on cobalt-iron-boron or permalloy.

22. The magnetoresistive sensor according to claim 18, wherein the second length is greater than the first length.

* * * * *